United States Patent [19]

Mitsui et al.

[11] Patent Number: 5,034,684
[45] Date of Patent: Jul. 23, 1991

[54] PROBE DEVICE AND METHOD OF CONTROLLING THE SAME

[75] Inventors: Kazuo Mitsui; Hiroshi Suzuki; Toshihiro Hosoda; Toshihiko Iijima; Shinji Niwa, all of Yamanashi; Tetsuji Watanabe, Nirasaki; Hideo Sakagawa, Kofu; Tetsuo Sato, Nirasaki, all of Japan

[73] Assignee: Tokyo Electron Limited, Tokyo, Japan

[21] Appl. No.: 426,010

[22] Filed: Oct. 24, 1989

[30] Foreign Application Priority Data

Oct. 24, 1988 [JP] Japan .................. 63-267830

[51] Int. Cl.5 .................. G01R 31/02; G01R 31/28
[52] U.S. Cl. .................. 324/158 F; 324/73.1; 371/22.1
[58] Field of Search ............... 324/158 F, 158 P, 73.1; 382/8; 364/478, 513, 559; 371/22.1, 22.6

[56] References Cited

U.S. PATENT DOCUMENTS

| 4,698,775 | 10/1987 | Koch et al. | 364/513 |
| 4,856,904 | 8/1989 | Akagawa | 324/158 F |

FOREIGN PATENT DOCUMENTS

| 57-68043 | 4/1982 | Japan . |
| 57-115843 | 7/1982 | Japan . |
| 60-10743 | 1/1985 | Japan . |
| 60-10745 | 1/1985 | Japan . |
| 60-49642 | 3/1985 | Japan . |
| 60-194535 | 10/1985 | Japan . |
| 61-168236 | 7/1986 | Japan . |
| 61-220349 | 9/1986 | Japan . |
| 62-235212 | 2/1987 | Japan . |
| 63-129640 | 6/1988 | Japan . |

*Primary Examiner*—Ernest F. Karlsen
*Attorney, Agent, or Firm*—Oblon, Spivak, McClelland, Maier & Neustadt

[57] ABSTRACT

A probe device having a loader unit and two measuring units is disclosed. Each of the loader and measuring units is an independent unit supported by an independent casing. Each of the loader and measuring units has its exclusive slave CPU and integrated circuit members are under the control of this slave CPU to manage operations of members at the unit. The slave CPUs are connected to a master CPU, which controls the slave CPUs and which is also an independent unit, and they are connected to one another only through the master CPU. Program language is common to the master and slave CPUs and the units can be electrically connected to form an integral control system in which signals are exchanged among the units.

15 Claims, 5 Drawing Sheets

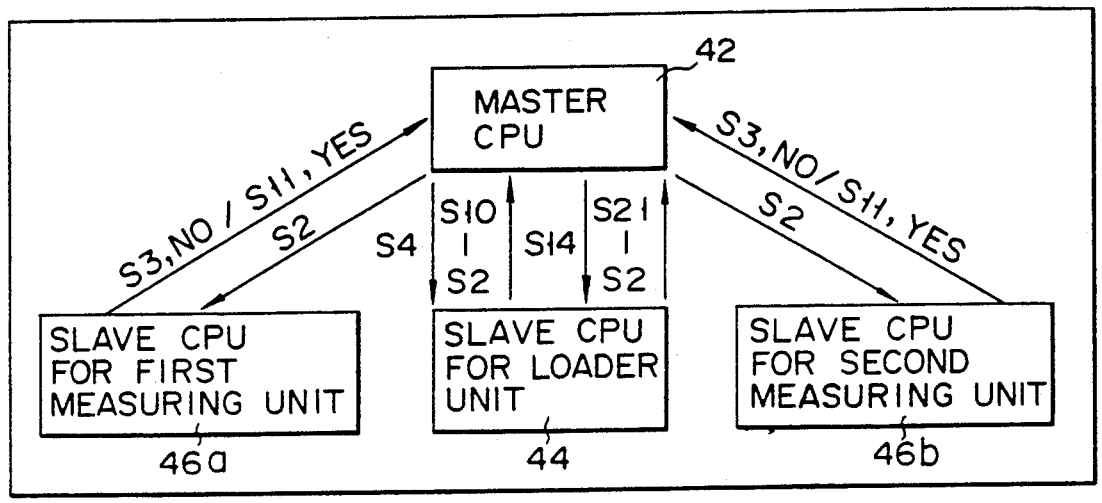
F I G. 5A
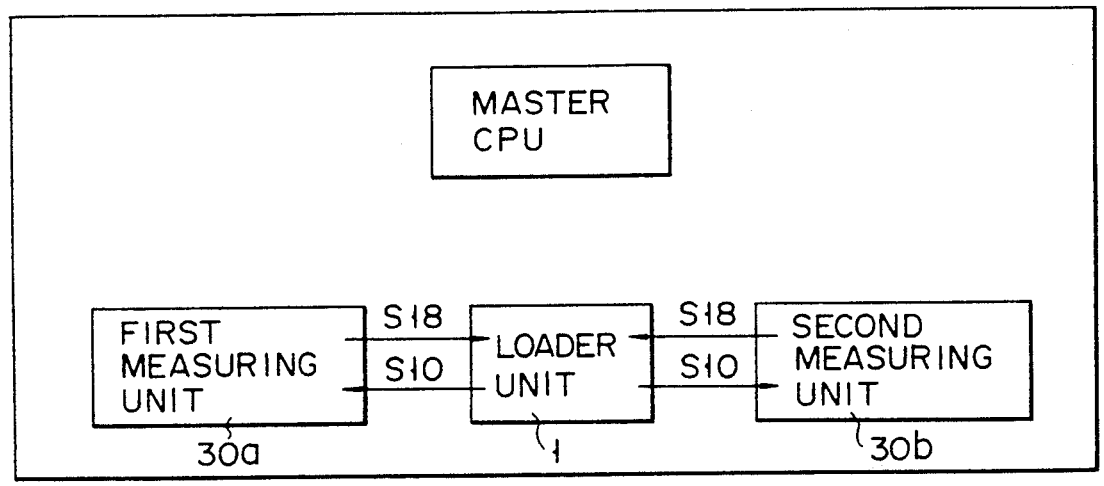
F I G. 5B

PROBE DEVICE AND METHOD OF CONTROLLING THE SAME

BACKGROUND OF THE INVENTION

1. Field of the Invention

The present invention relates to a probe device provided with an improved control system and suitable for measuring matters such as semiconductor wafers and more particularly, it relates to a probe device wherein loader and measuring sections have their respective slave CPUs and these slave CPUs are connected to each other through a master CPU and controlled by the master CPU.

2. Description of the Related Art

As the result of technological innovation, various kinds of semiconductor devices such as IC and LSI have been manufactured these days at factories. Various lines for manufacturing memory ICs, gate arrays and the like are usually arranged in each of clean rooms at these factories, depending upon what kinds of devices to be prepared, and each line is formed by those devices and apparatuses which can meet purposes of the line.

The probe device is also located to form a line in the clean room. The probe device usually has loader and measuring sections. The loader section has a system for housing a plurality of objects to be measured and a system for supplying the object to the measuring section. The measuring section has a system for supporting the object and a system for measuring it.

The amount of products prepared on the manufacturing line frequently and greatly changes depending upon needs created. As the amount of products changes like this, therefore, it is necessary to change the processing capacity of the probe device. In the case of the conventional probe device, however, the loader and measuring sections were paired. When such a kind of wafers as needed to be quickly processed were manufactured, therefore, they could not be processed quickly or it needed many hands to quickly process them. Providing that a cassette in which 25 sheets of wafers are housed is discharged from the manufacturing line, for example, the wafers will not be delivered to a next process until they are measured one by one from first to 25th sheet thereof by one probe device. Alternately, 25 sheets of wafers are manually picked up from the cassette and allotted to plural probe devices to be measured. However, this was not an automatic process and needed a great many hands.

When plural probe devices are arranged in the clean room to process a great many objects, various kinds of problems are caused. Because the clean room makes it difficult to spread its floor area and change its shape as its building and maintenance cost is so high.

In order to eliminate the above-mentioned drawbacks, Japanese Utility Model Disclosure (KOKAI) No. 60-41045 discloses a probe device comprising a measuring section and loader sections located on four sides of the measuring unit, said loader unit having wafers supply and housing systems. Japanese Patent Disclosure (KOKAI) No. 61-168236 discloses a probe device comprising a loader section and plural measuring sections located relative to the loader section.

Both devices disclosed by these references can contribute surely in an aspect to making the conventional probe devices more efficient and reducing the space occupied by the probe device. In the case of these two probe devices disclosed, however, they become large in size and their process patterns become fixed. When the processing capacity of the prove device is frequently asked to change in the clean room, when the layout of the lines is changed, and when probe devices must be exchanged between clean rooms or between factories to meet the change of the layout, therefore, the two probe devices disclosed causes more kinds of problems as compared with the conventional probe devices comprising one loader unit and one measuring unit.

SUMMARY OF THE INVENTION

An object of the present invention is therefore to provide a probe device capable of freely changing the combination of loader and measuring sections so as to meet any number of objects to be measured as well as any pattern of processing the objects.

Another object of the present invention is to provide a control system for the probe device capable of meeting any combination of loader and measuring sections.

These and other objects of the present invention can be achieved by a method of causing loader-section and measuring-section-exclusive processing means to directly control operations of the loader and measuring sections, and allowing the loader-section and measuring-section-exclusive processing means to be connected not directly to each other but through control means which controls the processing means.

A probe device according to the present invention comprises processing means exclusively used for a loader section to directly control the operation of the loader section, integrated circuit means controlled by the loader-section-exclusive processing means and serving to manage operations of members at the loader section, processing means exclusively used for a measuring section to directly control the operation of the measuring section, integrated circuit means controlled by the measuring-section-exclusive processing means and serving to manage operations of members at the measuring section, and a control means connected to the loader- and measuring-sections-exclusive processing means and serving to control these processing means, wherein the processing means are connected not directly to each other but through the control means.

Another probe device according to the present invention comprises processing means exclusively used for a loader section to directly control the operation of the loader section, integrated circuit means controlled by the loader-section-exclusive processing means and serving to manage operations of members at the loader section, said members for the loader section being supported by an independent casing and the loader section being essentially an independent unit, processing means exclusively used for a measuring section to directly control the operation of the measuring section, integrated circuit means controlled by the measuring-section-exclusive processing means and serving to manage operations of members at the measuring section, said members for the measuring section being supported by an independent casing and the measuring section being essentially an independent unit, and control means connected to the loader- and measuring-sections-exclusive processing means to control these processing means, said control means being also an independent unit, wherein the units can be detachably electrically connected to allow the control means and the processing means to form an integral control system in which signals are exchanged among them.

An optional number of the units can be therefore combined to form a desired probe device so as to meet any processing capacity needed.

BRIEF DESCRIPTION OF THE DRAWINGS

FIG. 5A shows flows of signals exchanged among CPUs in the case of the probe device;

FIG. 5B shows flows of wafers caused when signals are exchanged among the CPUs.

DETAILED DESCRIPTION OF THE PREFERRED EMBODIMENT

Figure 1:
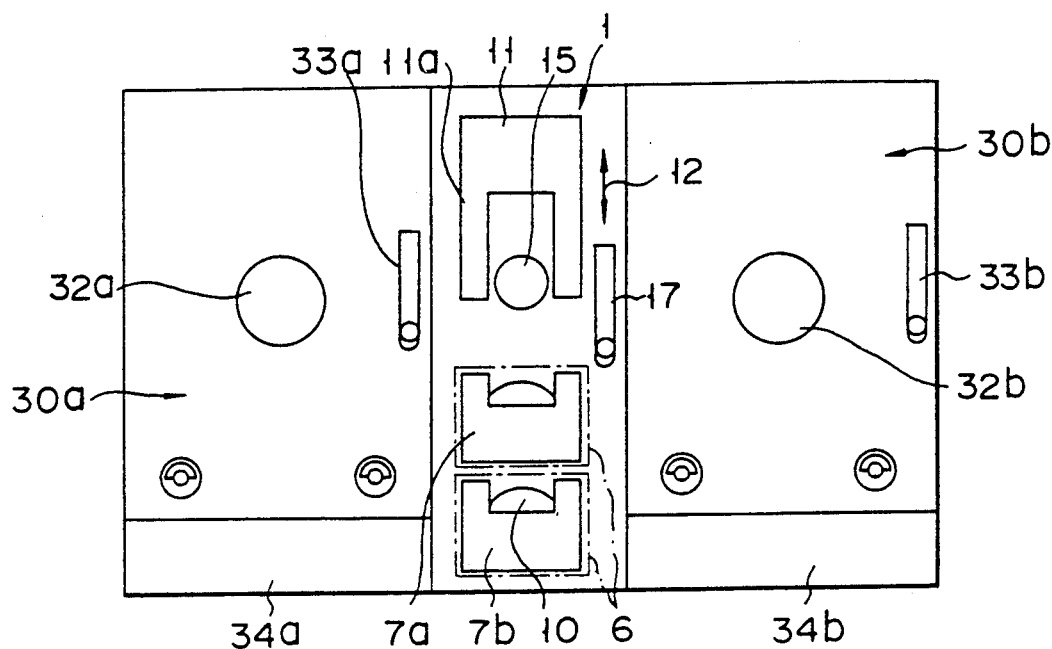
FIG. 1 is a plan showing the appearance of an example of the probe device according to the present invention, said probe device having one loader unit and two measuring units.
Figure 2:
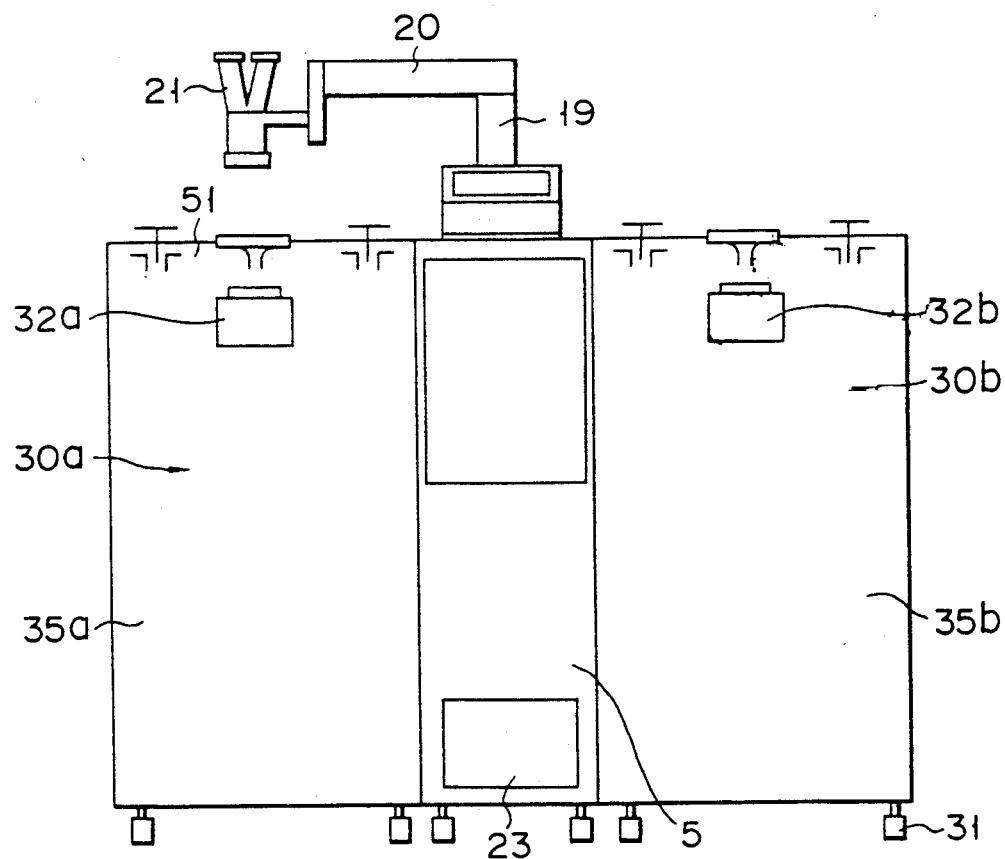
FIG. 2 is a front view showing the probe device.

As shown in FIGS. 1 and 2, a device for probing semiconductor wafers comprises loader unit 1 and two measuring units 30a and 30b located on both sides of loader unit 1. Loader unit 1 is partitioned by housing 5 and measuring units 30a and 30b are partitioned by housings 35a and 35b, respectively. Each of units 1, 30a and 30b is independent of the others and they can be connected to and disconnected from one another, depending upon what purposes the probe device is asked to achieve.

As shown in FIG. 1, loader unit 1 includes a pair of cassettes-mounting tables 6 freely movable to carry the cassettes thereon up and down. 25 sheets of wafers on which semiconductor chips to be measured are regularly formed are housed at an appropriated interval in each of paired cassettes 7a and 7b.

Vacuum suction fork 11 for carrying the wafers one by one into and out of cassette 7 can be moved vertically as well as horizontally in directions shown by arrows and it is a plate shaped like a reverse "U". Suction ports 11a are at the front ends of vacuum suction fork 11. Pre-alignment stage 15 on which wafers 10 can be placed is located between vacuum suction fork 11 and back cassette-mounting table 6 and can be driven in directions Z and θ. Vacuum suction arm 17 can be slidably rotated to carry wafers 10 from pre-alignment table 15 to the measuring stage of the measuring unit. This arm 17 is driven to horizontally rotate 360° by a motor (not shown). Arm 20 is attached to the upper back side of loader unit 1 through a shaft 19 and it can be horizontally rotated by 60° round shaft 19. Microscope 21 through which chips on the wafer can be viewed on an enlarged scale is attached to the foremost end of arm 20 and it can be moved up and down. Slave CPU 44 for controlling the operation of loader unit 1 exclusively is housed in loader unit 1 (see FIG. 3) and connected to a keyboard (not shown) which can be freely detached from the top of loader unit 1. Power source 23 is located on the bottom of loader unit 1 to supply power to measuring units 30a and 30b.

First and second measuring units 30a and 30b are same in arrangement but independent of the other and they can be located on either side of loader unit 1. Description will be made citing first measuring unit 30a.

Casters 31 are attached to the underside of the housing in which first measuring unit 30a is housed, and this enables first measuring unit 30a to be carried to any desired position. Loader unit 1 can be freely detachably bolted to either side of first measuring unit 30a.

Measuring stage 32a of first measuring unit 30a can be driven in directions X, Y, Z and θ by means of the well-known means and it can be symmetrically moved forward and backward and left and right at the center of first measuring unit 30a particularly in directions X and Y. Vacuum suction arm 33a which serves as an additional means is arranged on the top of first measuring unit 30a to vacuum-suck and carry wafers 10, which are placed on pre-alignment stage 15, to measuring stage 32a. This arm 33a is located on the right side on the top of first measuring unit 30a. Only arm 33a is used in this example, leaving arm 33b no used. The probe card is located facing measuring stage 32a and chips on the wafer are measured by the well-known means. The operation of first measuring unit 30a can be easily set by inputting parameters into slave CPU 46a through operation panel 34a. In other words, the operation of first measuring unit 30a is controlled by slave CPU 46a used exclusively for first measuring unit 30a (see FIG. 3). Operation process relating to the operation of first measuring unit 30a is carried out by master CPU 42 which is an independent unit (see FIG. 3). The appearance of this master CPU 42 is not shown in any of the drawings. Master CPU 42 can be located in one of those casings or housings in which loader unit 1 and measuring units 30a, 30b are housed.

Description made relating to first measuring unit 30a can be applied to second measuring unit 30b. Wafers 10 are carried to measuring stage 32b by vacuum suction arm 17 in the case of second measuring unit 30b. This vacuum suction arm of second measuring unit 30b serves as an additional means and it is not used in this example.

First and second measuring units 30a and 30b are located on both right and left sides of loader unit 1, or first measuring unit 30a is on the left side of loader unit 1 while second measuring unit 39b on the right side thereof, for example. Slave CPU 44 for loader unit 1 and slave CPUs 46a and 46b for first and second measuring units 30a and 30b are connected this time to master CPU 42, respectively.

Power is supplied from power source 23 in loader unit 1 to measuring units 30a and 30b. A control panel is attached to the front top of each of measuring units 30a and 30b and provided with an emergency stop switch. When this emergency stop switch is pushed on either of the control panels, the operation of the probe device can be stopped.

Detection switches which are different from the emergency stop switch and which can be turned on and off are arranged on loader unit 1 and measuring units 30a, 30b. When one of these detection switches is made operative, the probe device itself is not stopped but this-switch-attached one of the units 1, 30a and 30b is stopped and it can be started quickly after trouble is removed.

Figure 3:
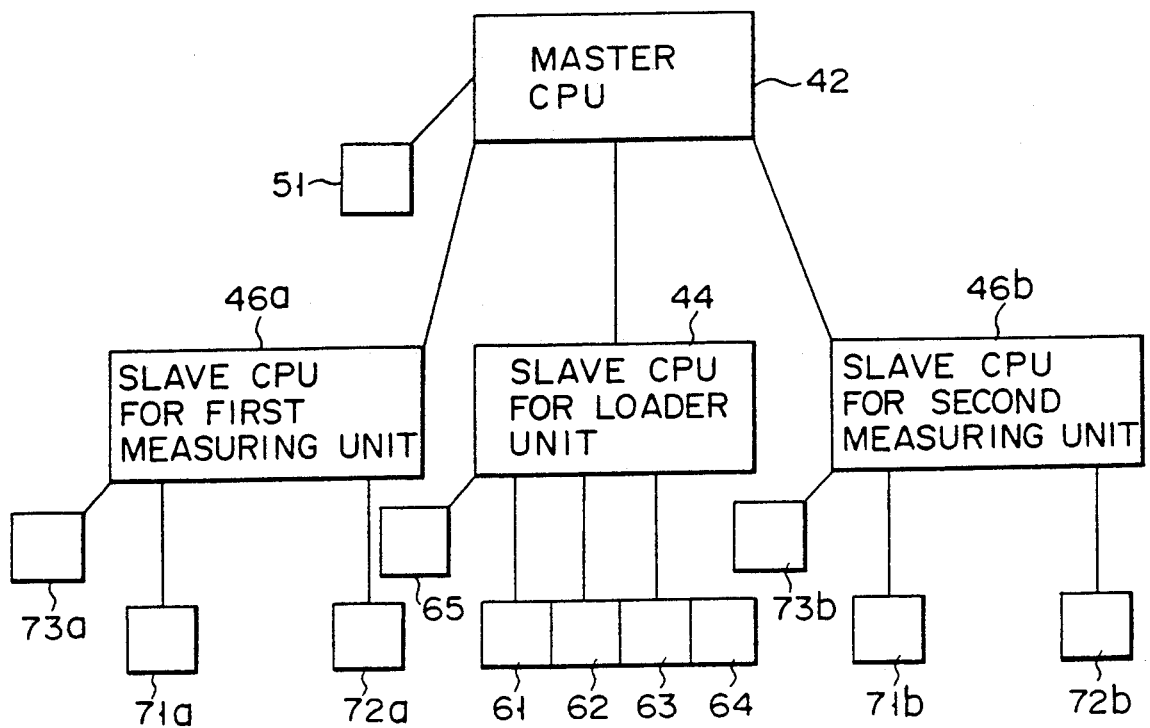
FIG. 3 shows a control system for the probe device.

FIG. 3 shows a control system for the probe device of the present invention. Exclusive slave CPUs 44, 46a and 46b are attached to units 1, 30a and 30b, respectively, to control the operations of these units. All of these slave CPUs are connected to master CPU 42 wherein these slave CPUs are connected not directly to one another but through master CPU 42.

The operations of units 1, 30a and 30b are controlled directly by exclusive slave CPUs 44, 46a and 46b. The following plural microchips (or microminiature integrated circuits) are therefore attached to each of exclusive slave CPUs 44, 46a and 46b to control the operation of each of units 1, 30a and 30b. Each of units 1, 30a and 30b is practically an independent block and, depending upon the processing capacity of the probe device, therefore, an optional number of the units can be combined with one another. As shown in FIGS. 1 and 2, for example, one loader unit 1 and two measuring units 30a and 30b can be combined, or two loader units and one measuring unit can be combined, as will be described later.

Master CPU 42 and slave CPUs 44, 46a and 46b have program language common to one another and when they are electrically connected to one another, they can form a control system in which signals are exchanged among them. As described above, it can be optionally selected how many slave CPUs are connected to master CPU 42.

Master CPU 42 serves to mainly manage slave CPUs 44, 46a and 46b. Further, master CPU 42 serves to directly manage microchip 51 to display information collected and stored therein on display screens on measuring units 30a and 30b.

Four microchips 61–64 belong to slave CPU 44 for loader unit 1. First chip 61 processes indexes for lifting both cassettes-mounting tables 6 to locate certain shelves of cassettes 7a and 7b at wafer-pickup and -return positions. Second chip 62 manages the operation of vacuum suction fork 11. Third chip 63 covers the operation or rotary operation of prealignment stage 15. Fourth chip 64 manages the operation of arm 17 in directions Z and θ. Sensor 65 for detecting the wafer on pre-alignment stage 15 also belongs to slave CPU 44 of loader unit 1.

Two microchips 71a and 72a belong to slave CPU 46a of first measuring unit 30a. First chip 71a manages the operation of measuring stage 32a in directions X and Y. Second chip 72a covers the operation of measuring stage 32a in directions Z and θ. Sensor 73a for detecting wafers on measuring stage 32a also belongs to slave CPU 46a of first measuring unit 30a.

Slave CPU 46b of second measuring unit 30b has two microchips 71b and 72b, which are same in operation as those of first measuring unit 30a. Namely, first chip 71b covers the operation of measuring stage 32b in directions X and Y. Second chip 72b manages the operation of measuring stage 32b in directions Z and θ. Sensor 73b for detecting wafers on measuring stage 32b also belongs to slave CPU 46b of second measuring unit 30b.

Figure 4A:
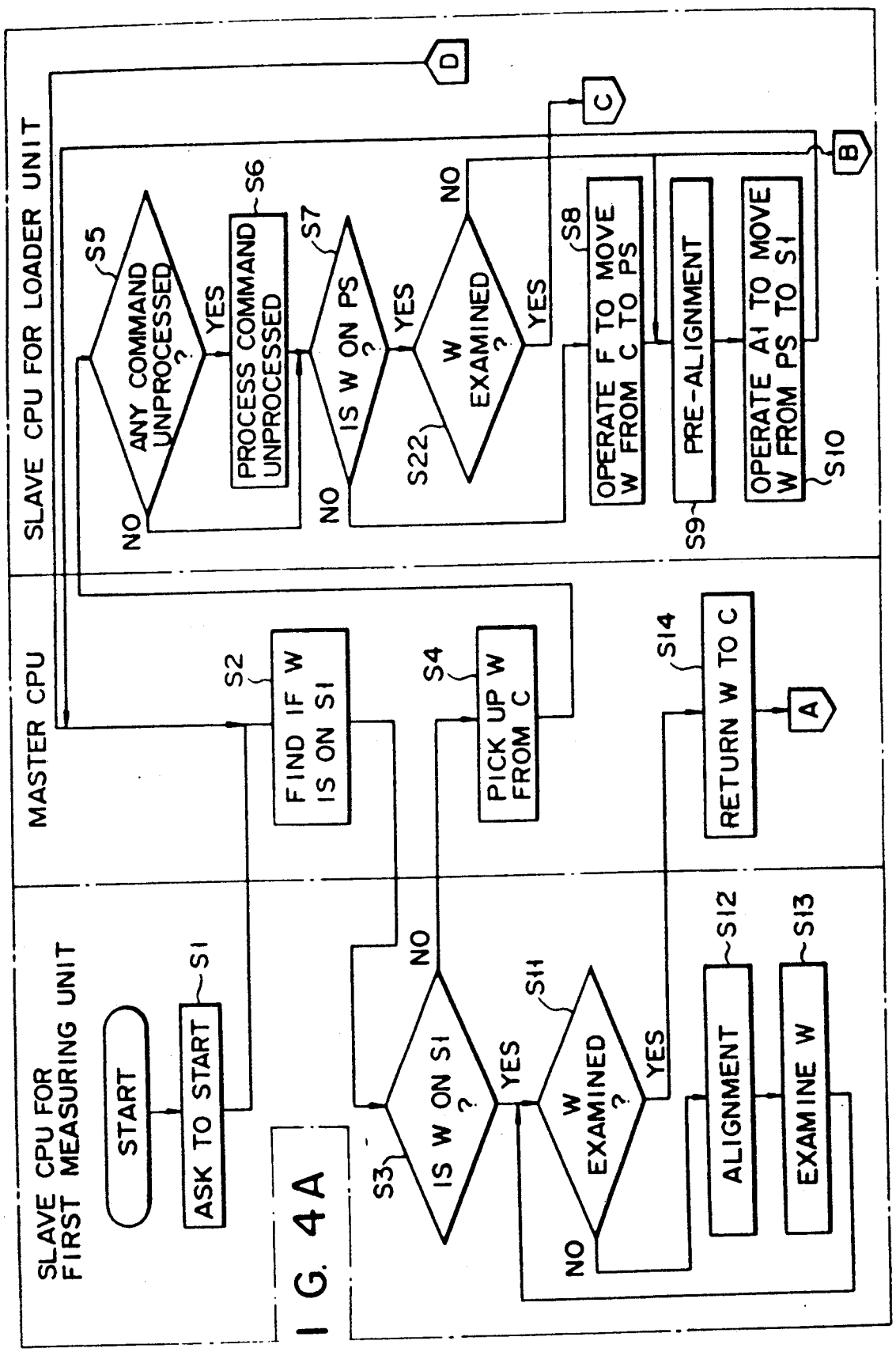
FIGS. 4A and 4B form a flow chart showing the control process of the probe device.
Figure 4B:
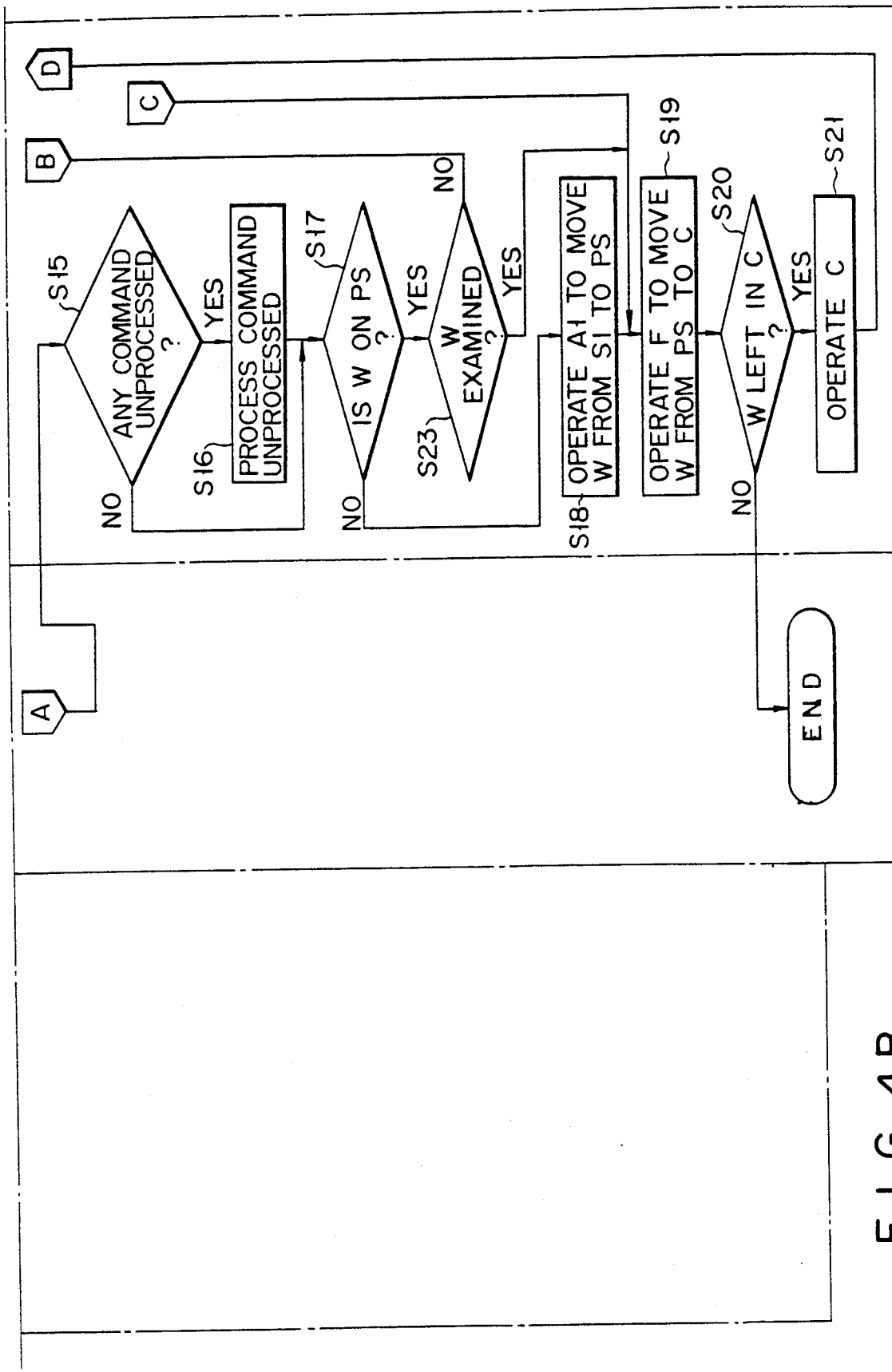

FIGS. 4A and 4B show a flow chart of control process comprising those steps which are conducted by master CPU 42, slave CPU 44 for the loader unit, and slave CPU 46a for the first measuring unit of the probe device according to the present invention. Although slave CPU 46b for the second measuring unit is omitted to make simpler and clearer the description relating to the flow chart shown in FIG. 4, it should be understood that same flow chart can also be applied to slave CPU 46b for the second measuring unit. The following abridged symbols are used in FIGS. 4A and 4B:
A1 represents arm 33a,
C cassette 7a or 7b,
F fork 11,
PS pre-alignment stage 15,
S1 measuring stage 32a, and
W a wafer.

FIG. 5A shows flows of main signals exchanged among CPUs in a case where two measuring units are combined with one loader unit. FIG. 5B shows flows of wafers caused when flows of main signals exchanged among CPUs are as shown in FIG. 5A. Symbols on arrows in FIGS. 5A and 5B corresponds to those steps shown in FIGS. 4A and 4B.

Measuring unit CPU 46a asks master CPU 42 at step 1 to start the operation. When asked like this, master CPU 42 stores that those wafers which are to be processed by this operation must be examined on the side of first measuring unit 30a. This information stored will be used in the course of selecting cassette 7a or 7b in which wafers to be picked up are housed, and carrying, examining and returning the wafers into cassette 7a or 7b.

Responsive to the above asking, master CPU 42 orders measuring unit CPU 46a at step 2 to recognize whether or not any wafer is on measuring stage 32a. When it receives this command, measuring unit CPU 46a detects at step 3 whether or not any wafer is on measuring stage 32a. When the answer is NO, measuring unit CPU 46a informs master CPU 42 of it.

When "NO" is answered, master CPU 42 commands loader unit CPU 44 at step 4 to pick up the wafer from designated cassette 7a or 7b. Loader unit CPU 44 stores this order once, but before this order is executed, it recognizes at step 5 whether or not there are still left any of those orders which have been previously received not processed yet. When the answer is "YES", those orders which have been previously received but not processed yet are processed at step 6 in the order of their having been received, and the flow is advanced to step 7. When the answer is "NO" at step 5, the flow is advanced directly to step 7 without passing through step 6.

Loader unit CPU 44 detects at step 7 whether or not any wafer is on pre-alignment stage 15. When the answer is "NO", vacuum suction fork 11 operates at step 8 to pick up the wafer from cassette 7a or 7b and carry it to pre-alignment stage 15. The wafer is detected of its size at the time when it is picked up from cassette 7a or 7b, and this detected size is stored in master CPU 42. The detection of wafer size is carried out by vacuum suction fork 11 which can be switched to hold any sizes of wafers. The information stored relating to the size of wafer is used in the course of housing wafers into cassette. Only when the size of a wafer to be housed is compared with that of cassette 7a or 7b into which the wafer is to be housed or inserted and they are in accordance with each other, it is allowed that the wafer is housed in the cassette. This is quite important in cases where cassettes 7a and 7b are different in size or one of them has a size of 5 inches and the other has a size of 8 inches, for example.

The wafer is positioned on pre-alignment stage 15 at step 9 and directed in a certain direction on the basis of its orientation flat. After this prealignment, arm 33a is made operative at step 10 to carry the wafer from pre-alignment stage 15 to measuring stage 32a.

The flow is returned to step 2 after step 10. The flow is then advanced from step 2 to step 3 and the answer is "YES" at step 3 unless any special trouble is caused, because the wafer has been carried onto measuring stage 32a at step 10.

Measuring unit CPU 46a recognizes at step 11 whether or not the wafer on measuring stage 32a is examined. The manner of recognizing this can be achieved either by picking up information from master CPU 42 or by using a specific detecting system. When the answer is "NO" at step 11, measuring unit CPU 46a moves measuring stage 32a in directions X, Y, Z and θ at step 12 to finely adjust the position of the wafer or carry out the fine alignment of the wafer. The wafer is then examined at step 13. After this examination, the flow is returned to step 11 and when the answer is "YES" at step 11, it is informed to master CPU 42.

When it receives the answer "YES", master CPU 42 commands loader unit CPU 44 at step 14 to house the wafer into cassette 7a or 7b. Loader unit CPU 44 stores this command once, but before this command is executed, it recognizes at step 15 whether or not there are left any of those commands which have been previously received not processed yet. When the answer is "YES", these commands which have been previously stored but not processed yet are processed at step 16 in the order of their having been received, and the flow is advanced to step 17. When the answer is "NO" at step 15, the flow is advanced directly to step 17 without passing through step 16.

Loader unit CPU 44 detects at step 17 whether or not any wafer is on pre-alignment stage 15. When the answer is "NO", arm 33a is made operative at step 18 to carry the wafer from measuring stage 32a to prealignment stage 15. Vacuum suction fork 11 is then made operative at step 19 to carry the wafer from prealignment stage 15 to designated cassette 7a or 7b where it is housed into cassette 7a or 7b.

Loader unit CPU 44 recognizes at step 20 whether or not wafers which are not examined yet are present in cassette 7a or 7b. The manner of recognizing this consists of picking up information from master CPU 42, using positions of shelves in the cassette as information source, or using a specific detecting system. Any of these manners can be used to recognize the presence of wafers, which are not examined yet, in cassette 7a or 7b. When the answer is "NO" at step 20, the examination at first measuring unit 30a is finished. When the answer is "YES" at step 20, however, cassette 7a or 7b is driven at step 21 and the flow is returned to step 2 to examine the wafers which are left not examined in cassette 7a or 7b.

When the answer is "YES" at step 7, loader unit CPU 44 recognizes at step 22 whether or not the wafer on pre-alignment stage 15 is examined. The manner of recognizing this is either to pick up information stored in master CPU 42 or to use a specific detecting system. When the answer is "YES" at step 22, the flow is advanced directly to step 19 and the wafer is returned from pre-alignment stage 15 to cassette 7a or 7b. When the answer is "NO" at step 22, the flow is advanced to step 9 and the wafer is carried to measuring stage 32a where it is examined.

When the answer is "YES" at step 17, loader unit CPU 44 recognizes at step 23 whether or not the wafer on pre-alignment stage 15 is examined. The manner of recognizing this is either to pick up information stored in master CPU 42 or to use a specific detecting system. When the answer is "YES" at step 23, the flow is advanced to step 19 and the wafer is returned to cassette 7a or 7b. When the answer is "NO" at step 23, the flow is advanced to step 9 and the wafer is carried to measuring stage 32a where it is examined.

The probe device comprising one loader unit and two measuring units is quite suitable for the following cases:
(1) where plural wafers, different in size, are tested using one loader unit,
(2) where simple test is applied to wafers at one measuring unit to remove deficient wafers and only remaining good wafers are tested at the other measuring unit,
(3) where two kinds of chips are formed on a wafer and one kind of chip on the wafer is tested at one measuring unit while the other kind of chip on the wafer is tested at the other measuring unit,
(4) where it is needed that same chip on a wafer is subjected to one test at one measuring unit and to the other test at the other measuring unit, and
(5) where test is applied to wafers at one measuring unit and deficient wafers are marked at the other measuring unit.

As described above, program language is common to master CPU 42 and slave CPUs for the measuring units and each of the measuring and loader units is an independent block. Depending upon the processing capacity of the probe device, an optional number of these units can be combined and electrically connected to form an integral control system in which signals can be exchanged among these units.

Figure 6:
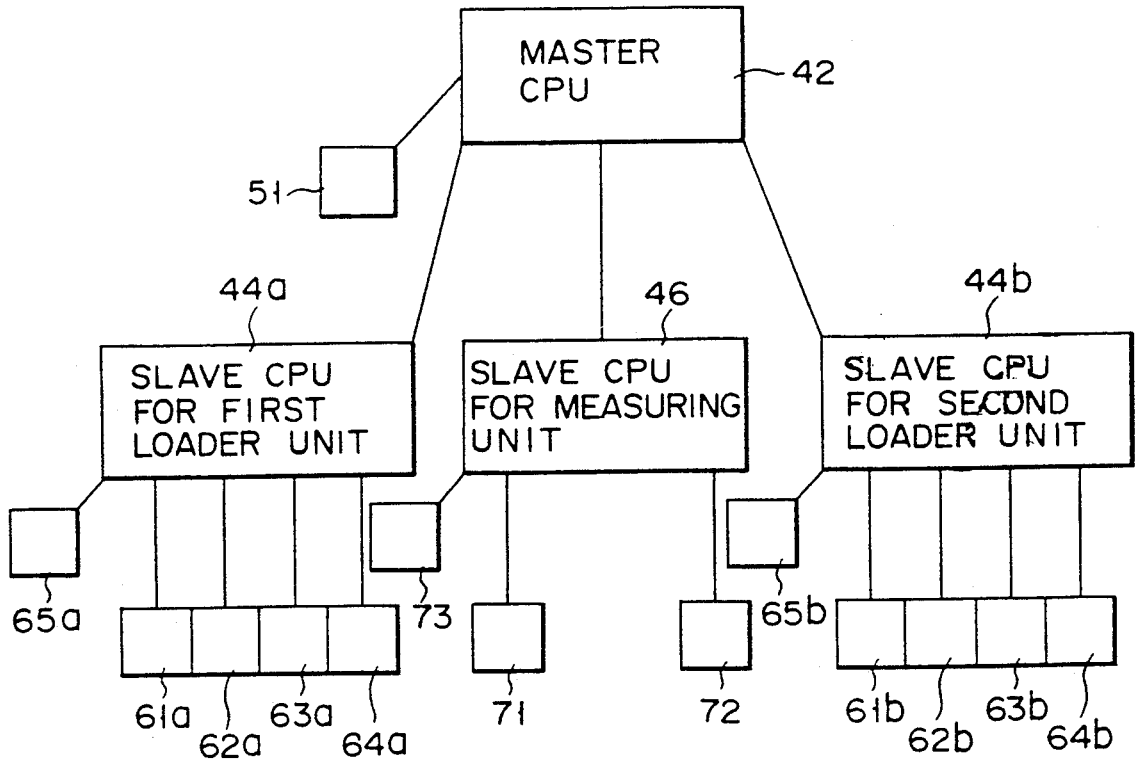
FIG. 6 shows a control system for a variation of the probe device according to the present invention, said probe device having two loader units and one measuring unit.

FIG. 6 shows another control system employed by a variation of the probe device according to the present invention which comprises two loader units and one measuring unit. Appearances of these units are not shown but they are fundamentally same as those shown in FIGS. 1 and 2. Therefore, members of these units will be represented by numerals and symbols which were used on same members of loader unit 1 and first measuring unit 30a. As shown in FIG. 6, slave CPUs 44a, 44b and 46 exclusively used for the units are connected to master CPU 42. Slave CPUs 44a, 44b and 46 are connected not directly to one another but through master CPU 42 also in the case of this variation of the probe device.

The operation of the unit is controlled directly by the slave CPU housed in this unit and exclusively used for the unit. Plural microchips managed by the slave CPU and serving to carry out their respective works are fundamentally same in function as those shown in FIG. 3.

Master CPU 42 controls mainly slave CPUs 44a, 44b and 46. Master CPU 42 also controls directly a microchip 51 to display information collected and stored on a display screen (not shown) on the measuring unit.

Microchips 61a—64a and 61b—64b belong to slave CPUs 44a and 44b for the loader units, respectively. First chips 61a and 61b process indexes for lifting both cassettes-mounting tables 6 to set certain shelves of cassettes 7a and 7b at wafers-pickup and -housing positions. Second chips 62a and 62b manage the operation of vacuum suction fork 11. Third chips 63a and 63b cover the operation or rotary operation of pre-alignment stage 15. Fourth chips 64a and 64b manage handling and operations of arm 17 in directions Z and θ. Sensors 65a and 65b for detecting the wafer on pre-alignment stage 15 belong to slave CPUs for the loader units.

Two microchips 71 and 72 belong to slave CPU 46 for measuring unit 30a. First chip 71 covers the operation of measuring stage 32a in directions X and Y. Second chip 72 manages the operation of measuring stage 32a in directions Z and θ. Sensor 73 for detecting the wafer on measuring stage 32a belongs to slave CPU 46 for first measuring unit 30a.

According to the probe device comprising one measuring unit and plural loader units as described above, various kinds and sizes of wafers can be processed by one measuring unit when probe cards of the measuring unit are variously exchanged with one another. This enables that space of an expensive clean room which is occupied by the probe device to be reduced.

Although the present invention has been described in detail citing some preferred embodiments shown in the drawings, it should be understood that various changes and modifications can be made without departing from the spirit and scope of the present invention.

For instance, a plurality of probe cards can be placed on a shelf, and can be used to measure various types of ICs. In this case, the probe device is equipped with a unit for automatically replacing one probe card with another probe card taken from a shelf so that ICs of another type can be measured by means of the other probe card. The program for operating this automatic card-replacing unit can be stored in a slave CPU.

What is claimed is:

1. A probe device including at least one loader section provided with means for housing plural objects to be measured and means for supplying the object to a measuring section, and at least one measuring section provided with means for measuring the object, said probe device further comprising a slave CPU exclusively used for the loader section to directly control the operation of the loader section, integrated circuit means controlled by the loader-section-exclusive slave CPU and serving to manage operations of members at the loader unit, said members for the loader section being supported by an independent housing and the loader section being essentially an independent unit, a slave CPU exclusively used for the measuring section to directly control the operation of the measuring section, integrated circuit means controlled by the measuring-section-exclusive slave CPU and serving to manage operations of members at the measuring section, said members for the measuring section being supported by an independent housing and the measuring section being essentially and independent unit, and a master CPU connected to the loader- and measuring-sections-exclusive slave CPUs to control these slave CPUs, said master CPU being also an independent unit and said slave CPUs being connected to one another through the master CPU, wherein the units can be detachably electrically connected to allow the master CPU and the slave CPUs to form an integral control system in which signals are exchanged among them.

2. The probe device according to claim 1, wherein more than one measuring section are arranged relative to one loader section.

3. The probe device according to claim 1, wherein two measuring sections are arranged relative to one loader section.

4. The probe device according to claim 1, wherein more than one loader section are arranged relative to one measuring section.

5. The probe device according to claim 1, wherein two loader sections are arranged relative to one measuring section.

6. The probe device according to claim 1, wherein each loader section and measuring section has dislodging means respectively.

7. The probe device according to claim 1, wherein said dislodging means consists of casters attached to the underside of the housing.

8. A probe device including at least one loader section provided with means for housing plural objects to be measured and means for supplying the object to a measuring section, and two measuring sections provided with means for measuring the object, said probe device further comprising a slave CPU exclusively used for the loader section to directly control the operation of the loader section, integrated circuit means controlled by the loader-section-exclusive slave CPU and serving to manage operations of members at the loader unit, said members for the loader section being supported by an independent housing and loader section being essentially an independent unit, two slave CPUs exclusively used each of the measuring sections to directly control the operation of each measuring section, integrated circuit means controlled by each measuring-section-exclusive slave CPUs and serving to manage operations of members at each measuring section, said members for each measuring sections being supported by an independent housing respectively and each measuring section being essentially and independent unit, and a master CPU connected to the loader- and measuring-sections-exclusive slave CPUs to control these slave CPUs, said master CPU being also an independent unit and said slave CPUs being connected to one another through the master CPU, wherein the units can be detachably electrically connected to allow the master CPU and the slave CPUs to form an integral control system in which signals are exchanged among them.

9. The probe device according to claim 8, wherein each loader section and measuring section has dislodging means respectively.

10. The probe device according to claim 8, wherein said dislodging means consists of casters attached to the underside of the housing.

11. The probe device according to claim 8, wherein two kinds of wafers, different in size, are tested at each measuring section.

12. The probe device according to claim 8, wherein simple test is applied to wafers at one measuring section to remove deficient wafers and only remaining good wafers are tested at the other measuring section.

13. The probe device according to claim 8, wherein two kinds of chips are formed on a wafer and one kind of chip on the wafer is tested at one measuring section while the other kind of chip on the wafer is tested at the other measuring section.

14. The probe device according to claim 8, wherein same chip on a wafer is subjected to one test and one measuring section and to the other test at the other measuring section.

15. The probe device according to claim 8, wherein test is applied to wafers at one measuring section and deficient wafers are marked at the other measuring section.

* * * * *